(12) United States Patent
Gau

(10) Patent No.: US 6,221,736 B1
(45) Date of Patent: Apr. 24, 2001

(54) FABRICATION METHOD FOR A SHALLOW TRENCH ISOLATION STRUCTURE

(75) Inventor: Jing-Horng Gau, Hsinchu Hsien (TW)

(73) Assignees: United Semiconductor Corp.; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/457,578

(22) Filed: Dec. 9, 1999

(51) Int. Cl.[7] .................................................. H01L 21/76
(52) U.S. Cl. .............................................. 438/435; 438/437
(58) Field of Search ..................................... 438/435, 436, 438/437

(56) References Cited

U.S. PATENT DOCUMENTS

| | | | |
|---|---|---|---|
| 5,358,893 | * 10/1994 | Yang et al. | 438/448 |
| 5,578,518 | * 11/1996 | Koike et al. | 438/424 |
| 5,646,052 | * 7/1997 | Lee | 438/426 |
| 5,968,842 | * 10/1999 | Hsiao | 438/692 |

* cited by examiner

*Primary Examiner*—Richard Elms
*Assistant Examiner*—Christian D. Wilson
(74) *Attorney, Agent, or Firm*—Thomas, Kayden, Horstemeyer & Risley

(57) ABSTRACT

A method for fabricating a shallow trench isolation structure is described, in which a pad oxide layer, a silicon oxy-nitride layer and the silicon nitride layer are sequentially formed on the substrate. Photolithography and etching are further conducted to form a trench in the substrate. A liner oxide layer is then formed on the exposed substrate surface in the trench, followed by removing portions of the silicon nitride layer and the silicon oxy-nitride layer by wet etching. After this, the trench is filled with an oxide material d the excessive oxide material is removed by using the silicon nitride layer as barrier layer. The remaining silicon nitride layer and the silicon oxy-nitride layer are further removed to complete the fabrication of a shallow trench isolation structure.

13 Claims, 3 Drawing Sheets

FABRICATION METHOD FOR A SHALLOW TRENCH ISOLATION STRUCTURE

BACKGROUND OF THE INVENTION

1. Field of the Invention

The present invention relates to a fabrication method for an integrate circuit. More particularly, the present invention relates to a fabrication method for a shallow trench isolation structure.

2. Description of the Related Art

Isolation structures formed in an integrated circuit are for the purpose to prevent carriers from penetrating through the substrate to neighboring devices. Electronic devices such as the metal oxide semiconductor field-effect transistor (MOSFET) are separated from each other by isolation structures to reduce a charge leakage. During the fabrication for the Very Large Scale Integration and the Ultra Large Scale Integration, the density of transistors is significantly increased. In order to prevent a short circuit between the neighboring transistor devices, isolation structures must form between the transistor devices. As the integration of a device continues to increase while the line width decreases as in the 0.25 deep sub-micron manufacturing, shallow trench isolation structures are formed to isolate the neighboring devices.

The conventional shallow trench isolation structure is formed by using anisotropic etching to form a trench in the substrate, followed by performing thermal oxidation to form a liner oxide layer on the exposed substrate surface. A non-doped oxide layer is then formed filling the trench, followed by a densification process and other processes to complete the formation of the device isolation structure.

FIGS. 1A to 1D are schematic, cross-sectional views showing the manufacturing of a shallow trench isolation structure according to the conventional practice. As shown in FIG. 1A, a pad oxide layer 102 and a silicon nitride layer 104 are formed on a semiconductor substrate 100. The silicon nitride layer 104 serves as a mask layer and to provide a barrier function.

Referring to FIG. 1B, the semiconductor substrate 100 is then defined to form a shallow trench 106. An oxide layer is then formed on the silicon nitride layer 104 and filling the shallow trench 106, followed by performing chemical mechanical polishing to form the oxide layer 108 in the trench as shown in FIG. 1C. The silicon nitride layer 104 is to provide a barrier function in the chemical mechanical polishing process.

Continuing to FIG. 1D, the silicon nitride layer 104 and the pad oxide layer 102 are removed to complete the fabrication of a shallow trench isolation structure. During the removal of the silicon nitride layer 104 and the pad oxide layer 102, especially in the removal of the pad oxide layer 102, the oxide layer 108 formed in the shallow trench is also being etched due to a partial exposure to the etchant. The edge 110 between the pad oxide layer 102 and the substrate 100 would form an irregular profile, exposing a corner of the substrate 100.

Since the properties of silicon nitride and oxide are different, for example different expansion coefficients, stress is generated and accumulated in the substrate during the formation of the shallow trench isolation structure. Furthermore, after the formation of the shallow trench isolation structure, an N-type or a P-type ion is implanted in the substrate to provide a conductive state in the substrate. During the ion implantation process, the ion bombardment on the substrate surface incurs damages on the crystal structure of the substrate. Additionally, for a semiconductor device with a line width less than 0.25 micron, stress is concentrated at the sharp corner of the shallow trench. A higher stress is thus resulted with the shallow trench isolation structure than the isolation structure formed by the traditional local oxidation of silicon, causing a crystal lattice dislocation is generated n the substrate. The conditions mentioned in the above would lead to a current leakage of the device.

SUMMARY OF THE INVENTION

Based on the foregoing, the present invention provides a fabrication method for a shallow trench isolation structure, wherein the stress generated during the fabrication of the semiconductor device is released. A current leakage is thus prevented and the effectiveness of the device is increased.

The present invention provides a fabrication method for a shallow trench isolation structure, wherein a pad oxide layer, a silicon oxy-nitride layer and a silicon nitride layer are sequentially formed on a substrate. Photolithography and etching are further conducted to from a trench in the substrate. Thermal oxidation is performed to form a liner oxide layer on the exposed substrate surface in the trench. After the formation of the liner oxide layer, portions of the silicon nitride layer and the silicon oxy-nitride layer are removed by wet etching. An oxide layer is then formed on the substrate, filling the trench. Using the silicon nitride layer as a barrier layer, the excessive oxide layer is removed. The remaining silicon nitride layer and silicon oxy-nitride layer are removed to complete the fabrication of the shallow trench isolation structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2G are schematic, cross-sectional views showing the fabrication of a shallow trench isolation structure according to a preferred embodiment of the present invention.

Figure 1A:
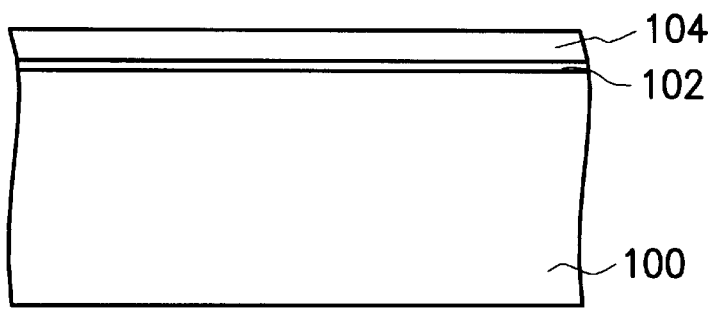
FIGS. 1A to 1D are schematic, cross-sectional views showing the fabrication of a shallow trench isolation structure according to the conventional practice.
Figure 1B:
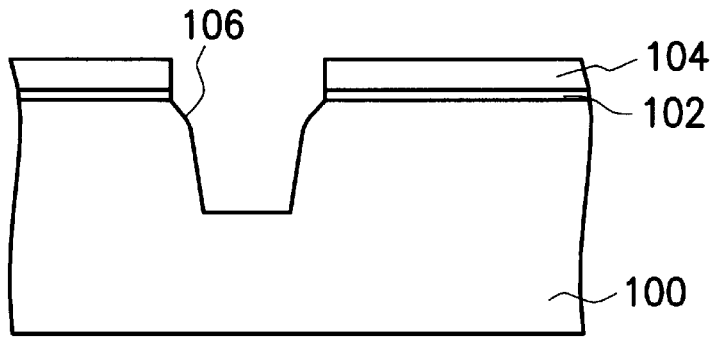
Figure 1C:
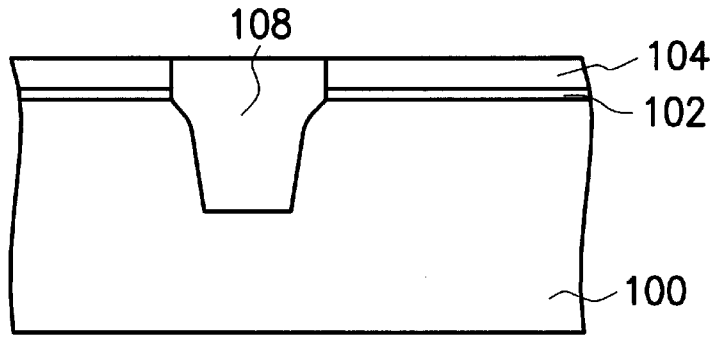
Figure 1D:
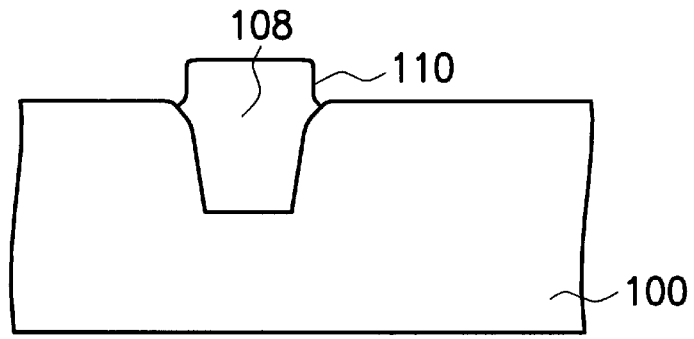
Figure 2A:
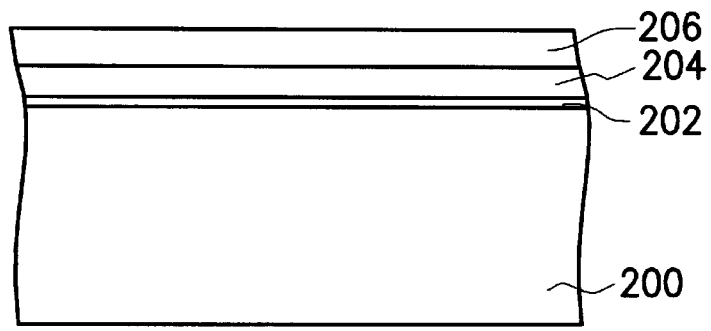
FIGS. 2A to 2G are schematic, cross-sectional views showing the fabrication of a shallow trench isolation structure according to a preferred embodiment of the present invention.

Referring to FIG. 2A, semiconductor substrate 200 is provide, followed by forming sequentially a pad oxide layer 202, a buffer layer 204 and a mask layer 206. The pad oxide layer is formed by, for example, thermal oxidation, wherein the substrate 200 surface is exposed to an oxygen-containing environment for silicon to react with oxygen to form silicon dioxide. The stress buffer layer 204, such as a silicon oxy-nitride layer of about 500 angstroms to about 1000 angstroms thick, is formed by for example, plasma enhanced chemical vapor deposition or low pressure chemical vapor deposition. The mask layer 206, includes a silicon nitride layer of about 500 angstroms to about 1000 angstroms thick, is formed by low pressure chemical vapor deposition.

Since the properties of silicon nitride and silicon dioxide are significantly different, a direct contact between the two materials would easily generate stress during the semiconductor fabrication processing, especially in a thermal process. On the other hand, the property of silicon oxy-nitride is in between the properties of silicon dioxide and silicon nitride. Stress, as a result, is not easily generated at the border between the silicon oxy-nitride layer and the silicon dioxide layer, or between the silicon oxy-nitride layer and the silicon nitride layer. The presence of the silicon oxy-nitride layer helps releasing the stress generated at the border between the silicon dioxide layer and the silicon nitride layer.

Figure 2B:
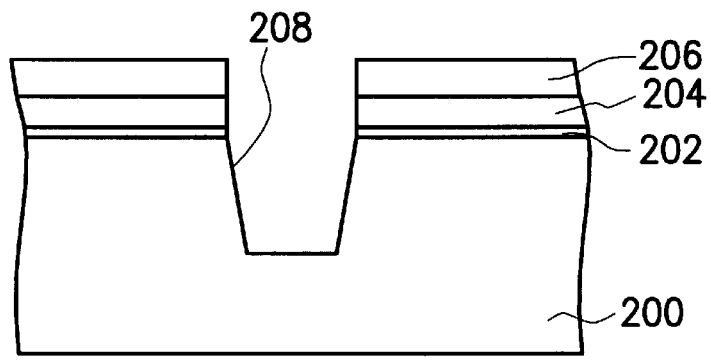

As shown in FIG. 2B, the mask layer is then defined, followed by an etching process to remove portions of mask layer 206, the stress buffer layer 204, the pad oxide layer 202 and the substrate 200 to form a trench 208 in the substrate 200.

Figure 2C:
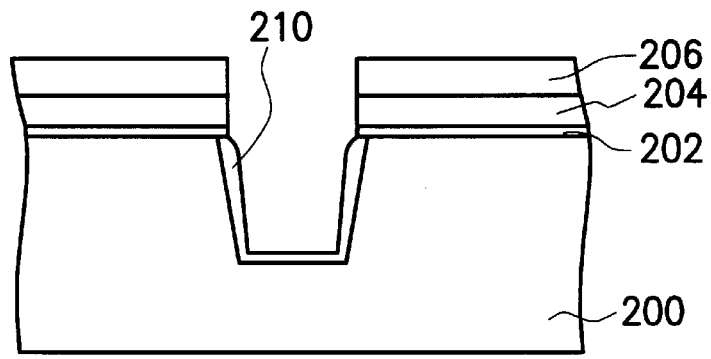

Continuing to FIG. 2C, thermal oxidation is conducted under an oxygen-containing environment to oxidize the exposed substrate 200 surface in the trench 208, forming a liner oxide layer 210.

Figure 2D:
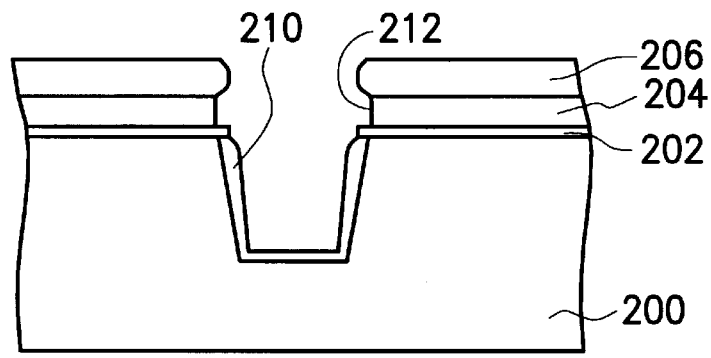

Referring to FIG. 2D, wet etching is conducted on the mask layer 206 and the stress buffer layer 204. The etchant used includes, for example, a hot phosphoric acid solution. Since the etching process is performed by submerging the entire wafer in the etchant solution, the exposed silicon nitride mask layer 206 and the silicon oxy-nitride stress buffer layer 204 are also being etched. Consequently, the exposed surface of the silicon nitride mask layer 206 and the silicon oxy-nitride buffer stress layer 204 are partially removed. Since the etching rate on silicon oxy-nitride as faster that on silicon nitride, the removal of the stress buffer layer 204 in the trench is more significant than the removal of the mask layer 206 in the trench 208, forming a recessed profile.

Figure 2E:
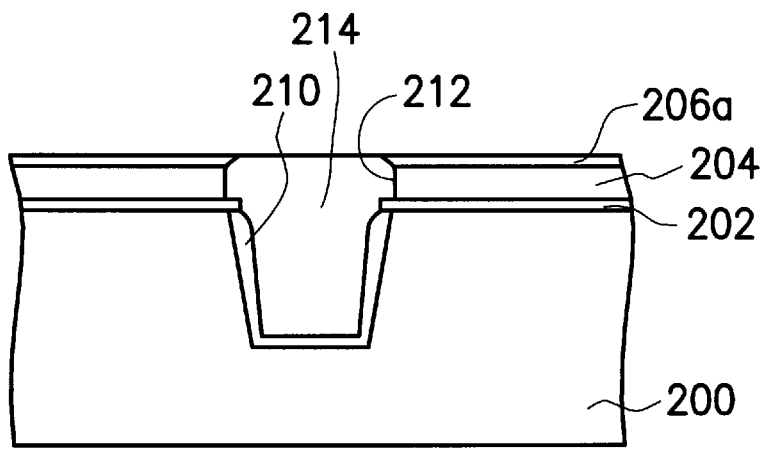

As shown in FIG. 2E, an insulating material 214, for example, a silicon dioxide layer, is formed on the surface of the mask layer 206, filling the trench 208. The insulating material 214 is formed by, for example, chemical vapor deposition. After this, a densification process is conducted on the gap filling insulating material 214 followed by chemical mechanical polishing to remove the portion of the insulating material 214 on the mask layer 206, leaving the insulating material 214 in the trench. A portion of the mask layer 206 is also removed from this polishing process, resulting with a much thinner mask layer 206a on the stress buffer layer 204.

Figure 2F:
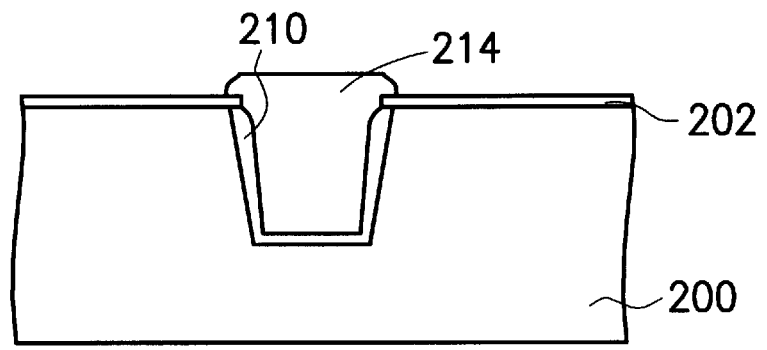

As shown in FIG. 2F, the remaining mask layer 206a is stripped, for example, by wet etching using an etchant containing a hot phosphoric acid solution. Due to the recessed profile on the sidewalls of the mask layer 206a and the stress buffer layer, the upper portion of the insulating layer 214 formed filling the trench 208 (as in FIG. 2B), covers the upper corner of the trench 208 in the substrate 200. The formation of a shallow trench isolation structure is thus completed.

Figure 2G:
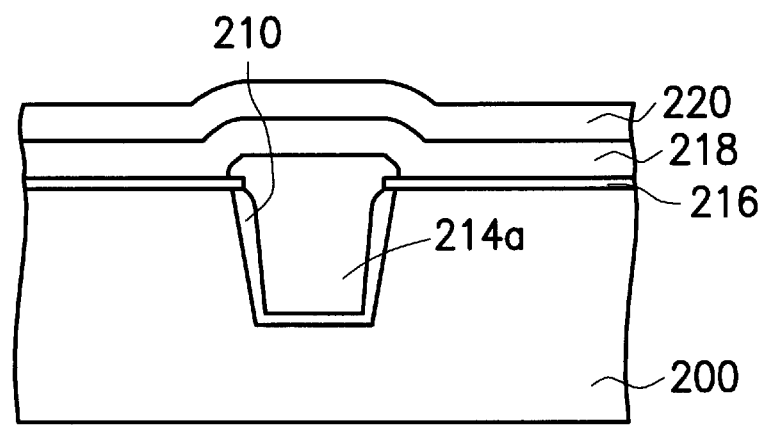

The subsequent processing procedures, as illustrated in FIG. 2G, include the removal of the pad oxide layer. Thermal oxidation is then conducted to form a gate oxide layer 216 on the substrate 200. Since the pad oxide layer 202 and the insulating material 214 that fills the trench are both oxide, a small portion of the insulating material 214 is also removed, forming the insulating material 214a.

Since the stress generated at between the mask layer and the pad oxide layer can be released by using the stress buffer layer, the thickness of the pad oxide layer can be thinner than that formed in the conventional practice. Consequently, the removal of the material 214 in the trench is reduced because the etching time to remove the pad oxide layer 202 is reduced.

Subsequently, a polysilicon layer 218 and a silicide layer 220, for example tungsten silicide, are sequentially formed on the gate oxide layer 216. A definition process is then conducted to define a gate structure (not shown in Figure), followed by other manufacturing processes to complete the formation of the transistor and other devices.

According to the preferred embodiment of the present invention, a silicon oxy-nitride layer is used as a stress buffer layer because the property of the silicon oxy-nitride layer is in between the properties of the silicon dioxide layer and the silicon nitride layer. As a result, the generation of stress at the border between the silicon dioxide layer and the silicon oxy-nitride layer or at the border between the silicon nitride layer and the silicon oxy-nitride layer is suppressed. Incorporating a silicon oxy-nitride between the pad oxide layer and the mask layer helps to release the stress generated at the border between the pad oxide layer and the mask layer.

In addition, a wet etching is conducted to form a recess on the sidewalls of the mask layer and the stress buffer layer before filling the trench with an oxide insulating material. The insulating material can thus cover the upper corner of the trench, preventing an exposure of the corner of the trench in the substrate and resulting with an ineffective device.

Furthermore, the silicon nitride mask layer is formed by low pressure chemical vapor deposition. The deposition of silicon nitride not only would cover the substrate surface, silicon nitride is also deposited on the back of the substrate or the wafer. During the removal of the silicon nitride mask layer, the silicon nitride on the back of the substrate must also be removed. After chemical mechanical polishing the silicon nitride mask layer according to the preferred embodiment of the present invention, the thickness of the silicon nitride layer is reduced. The total thickness of the silicon nitride mask layer and the silicon oxy-nitride stress buffer layer are about the same as the thickness of the silicon nitride layer on the back of the wafer. The wet etching time for the removal of the silicon nitride layer and the silicon oxy-nitride stress buffer layer can thus be shortened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a shallow trench isolation structure, the method comprising the steps of:

providing a semiconductor substrate;

forming a pad oxide layer on the semiconductor substrate;

forming a silicon oxy-nitride layer on the pad oxide layer;

forming a silicon nitride layer on the silicon oxy-nitride layer;

performing photolithography and etching to form a trench in the substrate through the silicon nitride layer, the silicon oxy-nitride layer and the pad oxide layer;

forming liner oxide layer on an exposed substrate surface in the trench;

removing portions of the silicon nitride layer and the silicon oxy-nitride layer in the trench by a wet-etching process to form a recessed profile on sidewalls of the silicon nitride layer and the silicon oxy-nitride layer;

filling the trench with an oxide material such that the oxide material covers upper corners of the trench; and sequentially removing a remaining of the silicon nitride layer, the silicon oxy-nitride layer and the pad oxide layer.

2. The fabrication method for a shallow trench isolation structure according to claim 1, wherein silicon oxy-nitride layer is about 500 angstroms to about 1000 angstroms thick.

3. The fabrication method for a shallow trench isolation structure according to claim 1, wherein silicon oxy-nitride layer is formed by plasma enhanced chemical vapor deposition or low pressure chemical vapor deposition.

4. The fabrication method for a shallow trench isolation structure according to claim 1, wherein the silicon nitride layer is about 500 angstroms to about 1000 angstroms thick.

5. The fabrication method for a shallow trench isolation structure according to claim 4, wherein the silicon nitride layer is formed by low pressure chemical vapor deposition.

6. The fabrication method for a shallow trench isolation structure according to claim 1, wherein after the step of filling the trench with an oxide material, the method further includes:

conducting a densification process on the oxide material; and performing chemical mechanical polishing to remove a portion of the oxide material on the silicon nitride layer.

7. The fabrication method for a shallow trench isolation structure according to claim 1, wherein the wet-etching process includes using a hot phosphoric acid solution as an etchant.

8. A fabrication method for a shallow trench isolation structure comprising the steps of:

providing a semiconductor substrate, wherein the semiconductor substrate comprises a pad oxide layer, a stress buffer layer and a mask layer;

removing portions of the mask layer, the stress buffer layer, the pad oxide layer and the semiconductor substrate to form a trench in the semiconductor substrate, wherein the trench exposes a portion of the substrate surface;

oxidizing the exposed substrate surface in the trench;

removing an exposed portion of the stress buffer layer and a portion of the mask layer in the trench by a wet etching process to form a recessed profile on sidewalls of the stress buffer layer and the mask layer;

forming an insulating material on the mask layer and filling the trench such that the insulating material covers upper corners of the trench;

removing the insulating material on the mask layer; and removing the mask layer, the stress buffer layer and the pad oxide layer.

9. The fabrication method for a shallow trench isolation structure according to claim 8, wherein stress buffer layer is about 500 angstroms to 1000 angstroms thick.

10. The fabrication method for a shallow trench isolation structure according to claim 8, wherein the mask layer is about 500 angstroms to 1000 angstroms thick.

11. The fabrication method for a shallow trench isolation structure according to claim 8, wherein the wet etching process includes using hot phosphoric acid as an etchant.

12. The method for fabricating a shallow trench isolation structure according to claim 8, wherein the step of removing the insulating material on the mask layer is by chemical mechanical polishing.

13. The method for fabricating a shallow trench isolation structure according to claim 8, wherein the insulating material includes silicon dioxide.

* * * * *